(12) United States Patent
Jaeger et al.

(10) Patent No.: US 10,090,365 B2
(45) Date of Patent: Oct. 2, 2018

(54) ORGANIC DEVICE

(71) Applicant: OSRAM OLED GmbH, Regensburg (DE)

(72) Inventors: Arndt Jaeger, Regensburg (DE); Tobias Pohl-Zander, Regensburg (DE); Arne Fleissner, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/510,196

(22) PCT Filed: Sep. 9, 2015

(86) PCT No.: PCT/EP2015/070636
§ 371 (c)(1),
(2) Date: Mar. 9, 2017

(87) PCT Pub. No.: WO2016/038100
PCT Pub. Date: Mar. 17, 2016

(65) Prior Publication Data
US 2017/0263687 A1   Sep. 14, 2017

(30) Foreign Application Priority Data

Sep. 12, 2014 (DE) .......... 10 2014 113 198
Dec. 10, 2014 (DE) .......... 10 2014 118 354

(51) Int. Cl.
*H01L 27/00* (2006.01)
*H01L 27/32* (2006.01)
(Continued)

(52) U.S. Cl.
CPC ...... *H01L 27/3225* (2013.01); *H01L 27/0255* (2013.01); *H01L 27/30* (2013.01);
(Continued)

(58) Field of Classification Search
CPC .................................................. H01L 51/5256
See application file for complete search history.

(56) References Cited

U.S. PATENT DOCUMENTS 8,502,204 B2   8/2013   Eissler et al.
9,246,121 B2   1/2016   Schicktanz et al.
(Continued)

FOREIGN PATENT DOCUMENTS

DE   102008049777 A1   11/2009
DE   102011084363 A1    4/2013
(Continued)

OTHER PUBLICATIONS

Daniel, J., "Printed Electronics: Technologies, Challenges and Applications," International Workshop on Flexible and Printed Electronics (IWFPE 10), Sep. 8-10, 2010, Muju Resort, Korea, pp. 1-2.

*Primary Examiner* — William Harriston
(74) *Attorney, Agent, or Firm* — Slater Matsil, LLP (57) ABSTRACT

An organic device is disclosed. In an embodiment the organic device includes an organic component designed to emit and/or detect radiation, wherein the organic component has a first layer stack and a radiation passage surface and an organic protection diode having a second layer stack, wherein the organic protection diode is arranged directly after the organic component in a stacking direction (Z), and wherein the organic protection diode is designed to protect the organic component from an electrostatic discharge and/ or from a polarity reversal of the organic component.

13 Claims, 3 Drawing Sheets

(51) Int. Cl.
*H01L 27/30* (2006.01)
*H01L 27/02* (2006.01)
H01L 51/00 (2006.01)
H01L 51/10 (2006.01)
H01L 51/44 (2006.01)
H01L 51/52 (2006.01)

(52) U.S. Cl.
CPC ........ *H01L 51/0003* (2013.01); *H01L 51/102* (2013.01); *H01L 51/441* (2013.01); *H01L 51/448* (2013.01); *H01L 51/5206* (2013.01); *H01L 51/5221* (2013.01); *H01L 51/5253* (2013.01); *H01L 2251/558* (2013.01)

(56) References Cited

U.S. PATENT DOCUMENTS

| | | |
|---|---|---|
| 2011/0049730 A1 | 3/2011 | Schmid et al. |
| 2011/0248244 A1* | 10/2011 | Ali .................. H01L 27/3209 |
| | | 257/40 |
| 2012/0132953 A1 | 5/2012 | Becker et al. |
| 2014/0361279 A1 | 12/2014 | Schicktanz et al. |
| 2015/0349036 A1 | 12/2015 | Popp et al. |

FOREIGN PATENT DOCUMENTS

| | | |
|---|---|---|
| DE | 102012223159 A1 | 6/2014 |
| WO | 2013053508 A1 | 4/2013 |
| WO | 2014090626 A2 | 6/2014 |
| WO | 2014090636 A1 | 6/2014 |

* cited by examiner

ORGANIC DEVICE

This patent application is a national phase filing under section 371 of PCT/EP2015/070636, filed Sep. 9, 2015, which claims the priority of German patent application 10 2014 113 198.3, filed Sep. 12, 2014 and German patent application 10 2014 118 354.1, filed Dec. 10, 2014, all of which are incorporated herein by reference in its entirety.

BACKGROUND

The patent application WO 2014/090626 A2 describes an organic device.

SUMMARY OF THE INVENTION

Embodiments provide an organic device which is particularly compact and long-lasting.

In various embodiments the organic device can be an organic optoelectronic unit, which is intended to emit and/or detect electromagnetic radiation. For example, the organic device is an organic light-emitting diode and/or an organic photodiode.

According to at least one embodiment of the organic device, this comprises an organic component designed to emit and/or detect radiation. The organic component comprises a first layer stack and a radiation passage surface. For example, the first layer stack is a functional radiation-emitting and/or radiation-detecting layer stack. The first layer stack can comprise a first hole-transport layer, a first electron-transport layer and/or an emission layer. The layers of the first layer stack can be formed using an organic functional material, e.g., a polymer, or can consist thereof. The radiation passage surface can be formed, e.g., by an external surface of an electrode of the organic component facing away from the first layer stack. This electrode can be of, e.g., radiation-permeable configuration.

Here and below, a material is of "radiation-permeable" configuration if it transmits at least 90%, preferably at least 95%, of the electromagnetic radiation from the spectral range relevant to the device impinging the material. Conversely, a material is of "radiation-reflecting" configuration if it reflects at least 90%, preferably at least 95%, of the electromagnetic radiation from the spectral range relevant to the device impinging the material. The relevant spectral range comprises or is the spectral range of the electromagnetic radiation emitted and/or to be detected by the device in operation.

The organic component comprises a main extension plane in which it extends in lateral directions. The stacking direction of the organic component runs perpendicular to the main extension plane, in the vertical direction. In the stacking direction, the organic component comprises a thickness. The thickness of the organic component is small compared to the lateral extent of the organic component and is, e.g., 10% at the most, in particular no more than 1% of the maximum lateral extent.

According to at least one embodiment of the organic device, this comprises an organic protection diode having a second layer stack. The second layer stack can comprise a second electron-transport layer, a second hole-transport layer and/or a matrix layer. The layers of the second layer stack can be formed using an organic functional material, e.g., a polymer, or can consist thereof. Preferably, the layers of the second layer stack comprise the same materials and/or material combinations as the layers of the first layer stack.

The matrix layer can be formed, e.g., using the material of the emission layer of the first layer stack, wherein the matrix layer can be undoped. In particular, the matrix layer can comprise an intrinsically conductive organic material. The organic protection diode can therefore be in particular a PIN diode.

The layers of the first layer stack and/or of the second layer stack can be arranged on top of one another and/or directly following one another in the stacking direction. Furthermore, each layer of the first layer stack and/or of the second layer stack can extend along the main extension plane.

According to at least one embodiment of the organic device, the organic protection diode is arranged directly after the organic component in the stacking direction. For example, the organic protection diode is in direct physical contact with the organic component.

According to at least one embodiment of the organic device, the organic protection diode is designed to protect the organic component from an electrostatic discharge. The organic protection diode can therefore be an ESD protection diode (ESD—electrostatic discharge). Furthermore, the protection diode can offer protection from inadvertent polarity reversal of the organic device.

According to at least one embodiment of the organic device, this comprises an organic component designed to emit and/or detect radiation having a first layer stack and a radiation passage surface and an organic protection diode having a second layer stack. The organic protection diode is arranged directly after the organic component in a stacking direction and is designed to protect the organic component from an electrostatic discharge.

The robustness of organic devices is determined by particles, such as, e.g., dust particles, incorporated during the production process and/or by short ESD pulses. Thus, e.g., when organic devices are being handled, electrostatic discharges can occur which can damage the organic device and lead to the failure of the organic device. Furthermore, particles landing on the organic device during the production thereof and/or entering one of the layers of the organic component can lead to leaks in encapsulation and/or failure of the organic device as a result of an electrical short circuit.

In the present case, the concept being pursued in particular is to provide an organic device having an integrated ESD protection diode which is monolithically integrated into the organic device. As a result, the organic component of the organic device is protected from electrostatic discharges while the monolithic integration enables omitting complex external wiring. Furthermore, the organic protection diode can be configured such that it protects the organic component mechanically from particles that can lead to a short circuit. For example, particles that could land on and/or enter one of the functional layers during production of the device can be enclosed in at least one functional layer of the organic protection diode and thus prevented from penetrating into the organic component. For this purpose, at least one functional layer of the organic protection diode can completely cover the organic component in the area of the first layer stack.

To this end, a second layer stack, which is designed as an organic PIN diode, is mounted on the organic component in the stacking direction. The additionally mounted organic protection diode comprises a stable, blocking reverse characteristic line, so that in normal operation of the organic device the flow of current is conducted through the organic component. In reverse operation of the organic device, on the other hand, practically all the current flows through the organic protection diode.

According to at least one embodiment of the organic device, a p-n junction of the organic protection diode is connected antiparallel to a p-n junction of the organic component. For example, the first hole-transport layer of the first layer stack is arranged before the first electron-transport layer in the stacking direction. In this case, the second hole-transport layer of the second layer stack is arranged after the second electron-transport layer of the second layer stack in the stacking direction. Alternatively, it is possible that the first hole-transport layer is arranged after the first electron-transport layer in the stacking direction and the second hole-transport layer is arranged before the second electron-transport layer in the stacking direction.

In the two cases just mentioned, the emission layer can be arranged between the first hole-transport layer and the first electron-transport layer in the stacking direction. The matrix layer can be arranged between the second hole-transport layer and the second electron-transport layer in the stacking direction.

According to at least one embodiment of the organic device, this comprises a first electrode and a second electrode mounted on a side of the first layer stack facing away from the first electrode. Furthermore, the organic device comprises a third electrode mounted on a side of the second layer stack facing away from the first electrode.

The first electrode can be provided in particular for the electrical contact of the first layer stack. For this purpose, for example, the first electrode is adjacent to one of the layers of the first layer stack. The first electrode can be formed using a transparent conductive oxide, such as, e.g., indium tin oxide, or can consist of such a transparent conductive oxide. An external surface of the first electrode facing away from the first layer stack can form in particular the radiation passage surface.

The second electrode is preferably in direct electrical and/or physical contact with the first layer stack and second layer stack. For example, the second electrode is arranged between the first layer stack and the second layer stack in the stacking direction. The second electrode can be provided for the purpose of making electrically conductive contact with both the first layer stack and the second layer stack. The second electrode can in this case be part of both the organic component and the organic protection diode.

For example, the second electrode simultaneously forms the cathode of the organic component and the anode of the organic protection diode. Alternatively, it is possible that the second electrode simultaneously forms the anode of the organic component and the cathode of the organic protection diode. As a result of this simultaneous electrical contact with the second layer stack and the first layer stack, in particular an organic device of extremely compact configuration can be provided.

The third electrode can be provided for the electrical contact of the second layer stack. For example, for this purpose the third electrode is adjacent to one of the layers of the second layer stack. For example, the second electrode and/or the third electrode can be formed using an electrically conductive and radiation-reflecting material, such as a metal or metal alloy, or can consist thereof. In particular, the second electrode and/or the third electrode are of radiation-reflecting configuration.

According to at least one embodiment of the organic device, the first electrode and the third electrode are connected to one another in an electrically conductive manner by means of a connecting layer. It is possible here that the connecting layer is not a layer in the narrower technical sense but, e.g., a wire connection. The connecting layer extends, for example, along the stacking direction on at least one lateral surface of the organic component and/or on at least one lateral surface of the organic protection diode. Advantageously, the connecting layer can additionally act as the lateral encapsulation of the organic component and/or of the organic protection diode. An "encapsulation" here and below refers to a layer that protects the organic layers of the organic component and/or of the organic protection diode from external influences, in particular from atmospheric gases and/or moisture penetration. The "lateral surfaces" of a layer and/or component here and below can be external surfaces of the layer and/or component running along the stacking direction.

According to at least one embodiment of the organic device, the second layer stack comprises a layer structure. The layer structure can be arranged between the first and third electrode, in particular between the second and third electrode. In particular, the layer structure is arranged between the first layer stack of the organic component and the functional layers of the protection diode. For example, the layer structure is adjacent to the second electrode. The layer structure has a thickness in the stacking direction of at least 5 µm, preferably at least 10 µm, and no more than 200 µm, preferably no more than 100 µm. Here and below, the "thickness" of a layer is intended to mean its average spatial extent along the stacking direction, wherein the actual thickness at a lateral point of the layer can deviate from the average thickness by no more than ±20%, preferably no more than ±10%.

The layer structure can form the hole-transport layer or the electron-transport layer of the organic protection diode. Preferably, a layer of the layer structure is adjacent to the second electrode. The layer structure can be formed using multiple layers, which can, for example, consist of different materials and/or can be produced using different production methods.

According to at least one embodiment of the organic device, the layer structure comprises at least one buffer layer. For example, the buffer layer is formed using an organic conductive polymer, such as, e.g., PEDOT:PSS or PANT. The buffer layer has in particular a thickness of at least 5 µm, preferably at least 10 µm, and no more than 200 µm, preferably no more than 100 µm. For example, at least 90%, preferably at least 95%, of the thickness of the layer structure can be formed by the thickness of the buffer layer.

The buffer layer is preferably produced by a solution-processed method. A solution-processed method can be a printing method, such as, e.g., an inkjet method, a screen printing method, an intaglio printing method or a flexographic printing method. In particular, the material of the buffer layer can be processed from an aqueous solution.

One of the concepts being pursued here is to provide a thick buffer layer which mechanically protects the organic component from external influences, such as, e.g., particles. In particular, a solution-processed method is suitable for producing the buffer layer. In contrast to gas phase deposition, which is normally used for applying organic layers, a solution-processed method is distinguished by the fact that a buffer layer having a high thickness can be provided within a short time. With an inkjet method, for instance, thicknesses of the buffer layer of up to 20 µm can be realized within a reasonable time, and with a screen printing method up to 100 µm.

In particular, in an ISO class 5 clean room, which is typically used in the production of an organic device as described here, a large part of the particles present in the air have a size of up to 5 μm. The size of a particle here and below can be the greatest lateral extent of the particle in a spatial dimension. During production of the organic device, these particles can land on one of the layers of the organic device, in particular on the finished first layer stack of the organic device, as a result of which, e.g., the layers lying below this layer in the stacking direction can be destroyed if pressure is placed on the organic device. Furthermore, these particles can lead to a short circuit in the organic device. These particles can be completely enclosed in the buffer layer, which has a thickness of at least 5 μm. As a result, the functional layers of the organic component can be protected from the particles.

According to at least one embodiment of the organic device, the layer structure comprises the buffer layer and at least one sealing layer. The sealing layer is arranged between the organic component and the buffer layer in the stacking direction. For example, the sealing layer is adjacent to the second electrode. Alternatively or in addition, the sealing layer can be adjacent to the buffer layer.

The sealing layer and the buffer layer are produced by different methods. For example, the buffer layer is produced by a solution-processed method while the sealing layer is produced by means of gas phase deposition, such as, e.g., thermal gas phase deposition. The sealing layer can be vapor-deposited on the second electrode.

In particular, the sealing layer and buffer layer can consist of and/or contain the same materials. For example, the sealing layer and the buffer layer together can form the hole-transport layer or the electron-transport layer of the organic protection diode.

The buffer layer has at least 10 times the thickness of the sealing layer in the stacking direction. The sealing layer is therefore a thinly vapor-deposited layer, which preferably encapsulates the organic component. The sealing layer has a thickness, e.g., of no more than 1 μm.

The sealing layer is in particular provided to protect the layers of the organic component from the solvent used in the production of the buffer layer. For example, the sealing layer can be formed using a chemically curable material. Such a thin sealing layer is insoluble after curing and acts as a protection layer against the thick buffer layer subsequently applied from a solution.

According to at least one embodiment of the method, the second electrode of the organic device is formed from a material which is insoluble in the solvent used in the solution-processed method for producing the buffer layer. For example, the second electrode can be formed using aluminum or can consist of aluminum. Furthermore, at least one lateral surface of the first layer stack can be covered by the second electrode. As a result, the organic layers of the first layer stack can be effectively encapsulated against the solution-processed buffer layer.

According to at least one embodiment of the organic device, the sealing layer of the layer structure is adjacent to the second electrode. In particular, the sealing layer of the layer structure completely covers the second electrode on external surfaces of the second electrode facing away from the first layer stack in the area of the buffer layer. "In the area of the buffer layer" here and below means that the sealing layer likewise completely covers the areas of the second electrode which completely cover the buffer layer. For example, the second electrode can be electrically contacted in an area laterally spaced apart from the buffer layer and is not covered by the sealing layer there.

Alternatively, the sealing layer can be adjacent to the first layer stack and directly encapsulate the first layer stack at least in places. Preferably, the second layer stack is completely covered by the second electrode and/or by the sealing layer on its external surfaces facing the buffer layer.

According to at least one embodiment of the organic device, the second electrode comprises an ALD layer. In particular, the second electrode can be an ALD layer. The ALD layer is created using atomic layer deposition (ALD). ALD layers are known, e.g., from US published patent applications US 2011/0049730 A1 and US 2012/0132953 A1, the disclosures of which are hereby incorporated by reference. An ALD layer of this type produced by an ALD method is distinguished in particular by its high impermeability to solvents in particular and/or the conformal coverage of corners and/or edges.

A layer produced by an ALD method can be clearly differentiated from layers produced by alternative methods, such as, e.g., gas phase deposition, by means of examinations by electron microscopy and/or other analytical methods from semiconductor technology. Production by atomic layer deposition can therefore be verified on the finished organic device.

The ALD layer can in particular be configured to be electrically conductive. For example, the ALD layer is formed using a transparent, electrically conductive oxide, such as, e.g., tin oxide, indium tin oxide and/or aluminum tin oxide, or consists of such an oxide.

According to at least one embodiment of the organic device, the organic component is completely covered on its external surface facing away from the radiation passage surface by at least one layer of the organic protection diode. In other words, at least one layer of the organic protection diode encapsulates the organic component and/or hermetically seals it externally. The concept being pursued here is in particular to protect the organic component from environmental influences, such as, e.g., moisture, and thus avoid destruction of the functional layers of the first layer stack.

Alternatively or in addition, the first layer stack can be covered and/or encapsulated completely on its external surface facing away from the radiation passage surface by at least one layer of the organic protection diode. The second electrode can be regarded here as a layer of the organic component and of the organic protection diode.

BRIEF DESCRIPTION OF THE DRAWINGS

Hereinafter, the organic device described here is explained in more detail using exemplary embodiments and the associated figures.

Identical or similar elements or elements having the same effect are provided with the same reference numerals in the figures. The figures and the size ratios to one another of the elements illustrated in the figures should not be considered as being to scale. Rather, to illustrate them better and/or to make them easier to understand, the size of individual elements may be exaggerated.

DETAILED DESCRIPTION OF ILLUSTRATIVE EMBODIMENTS

Figure 1:
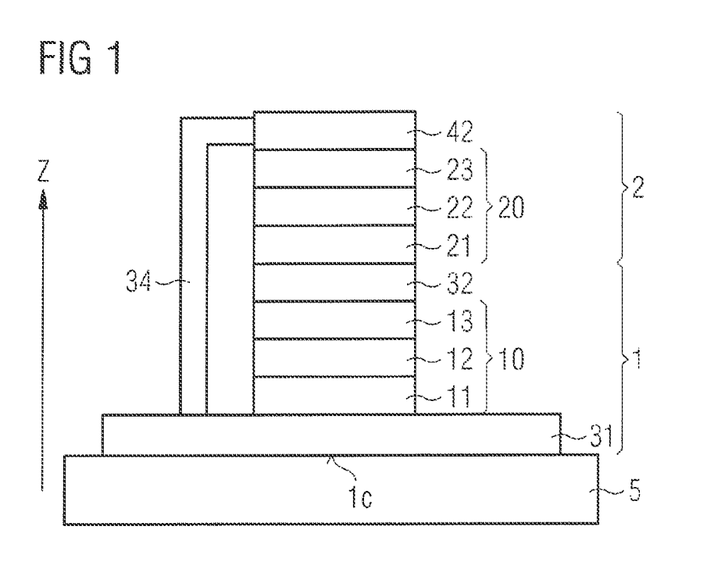
FIG. 1 shows a first exemplary embodiment of an organic device as described here using a sectional illustration.

Using the sectional diagram of FIG. 1, a first exemplary embodiment of an organic device as described here is explained in more detail. The organic device comprises a substrate 5, an organic component 1, and an organic protection diode 2. The organic component 1 and the organic protection diode 2 follow the substrate 5 in a stacking direction Z. The organic component 1 comprises a first electrode 31, which includes a radiation passage surface 1c. The radiation passage surface is here faces the substrate 5. The substrate 5 and the first electrode 31 can be of radiation-permeable configuration. For example, the substrate 5 is formed using a glass or a plastic. The first electrode 31 can be formed using a transparent conductive oxide, such as, e.g., indium tin oxide.

On the side of the first electrode 31 facing away from the substrate 5, a first layer stack 10 is arranged. The first layer stack 10 comprises a conductive first layer 11, an emission layer 12 and a conductive second layer 13, which follows the first layer 11 and the emission layer 12 in the stacking direction Z. The first layer 11 can be the first electron-transport layer of the first layer stack and the second layer 13 can be the first hole-transport layer of the first layer stack. Alternatively, it is possible that the first layer 11 is the first hole-transport layer and the second layer 13 is the first electron-transport layer of the first layer stack.

The first layer stack 10 can also comprise further layers, not illustrated in the figures. For example, the first layer stack 10 can comprise hole-blocking layers and/or electron-blocking layers. Furthermore, it is possible that the first layer stack 10 comprises multiple emission layers 12, preferably arranged on top of one another in the stacking direction Z, which can, for example, emit light of different colors. This allows the provision of in particular an organic device that emits white light.

The second layer 13 is followed by a second electrode 32 in the stacking direction. The second electrode 32 is of radiation-reflecting design and can be formed using, e.g., a metal or a metal alloy. The first electrode 31, the first layer stack 10 and the second electrode 32 together form the organic component 1.

The first layer stack 10 is followed by a second layer stack 20 in the stacking direction Z. The second layer stack 20 here is adjacent to the second electrode 32. The second layer stack comprises a layer structure 21, a matrix layer 22 and a conductive further layer 23.

The layer structure 21 can be the second hole-transport layer of the organic protection diode. The further layer 23 can be the second electron-transport layer of the second layer stack. In this case, the second electron-transport layer of the organic protection diode 2 would therefore be arranged after the second hole-transport layer in the stacking direction Z. Alternatively, however, it is also possible that the layer structure 21 is the second electron-transport layer and the further layer 23 is the second hole-transport layer. The choice of the arrangement of the second electron-transport layer and the second hole-transport layer should be made such that the p-n junction of the organic component 1 is connected antiparallel to the p-n junction of the organic protection diode 2.

On the second electron-transport layer 23 of the second layer stack 20, a third electrode 42 is arranged in the stacking direction. The second electrode 32, the second layer stack 20 and the third electrode 42 together form the organic protection diode 2. The second electrode 32 can therefore simultaneously form the cathode of the organic component 1 and the anode of the organic protection diode 2. Alternatively, it is possible that the second electrode simultaneously forms the anode of the organic component 1 and the cathode of the organic protection diode 2.

The third electrode 42 is connected to the first electrode 31 by a connecting layer 34 arranged laterally to the first layer stack 10 and/or second layer stack 20. In particular, the first electrode 31 and the third electrode 42 are connected electrically conductive to one another via the connecting layer 34.

Figure 2:
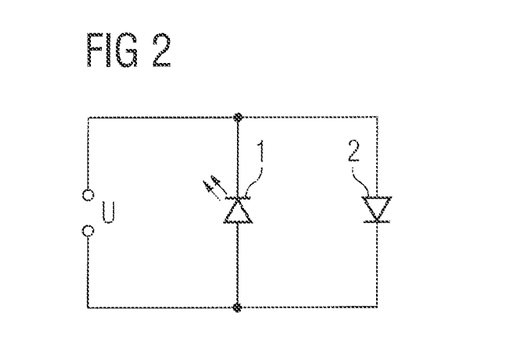
FIG. 2 shows a substitutional circuit diagram of an organic device as described here.

According to the substitutional circuit diagram of FIG. 2, the way in which the organic device as described here functions is explained in more detail. The organic device comprises an organic component 1 and an organic protection diode 2. These are electrically connected with a voltage U. The organic protection diode 2 is connected antiparallel to the organic component 1. The organic protection diode 2 can thus act as an ESD protection diode for the organic component 1.

Figure 3:
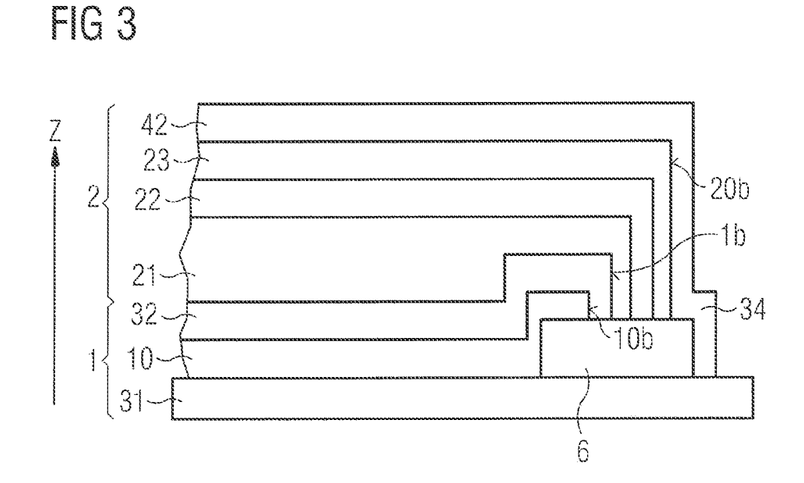
FIGS. 3 to 4 show exemplary embodiments of an organic device as described here using sectional illustrations.

According to the sectional illustration of FIG. 3, a further exemplary embodiment of an organic device as described here is explained in more detail. In contrast to the exemplary embodiment illustrated in FIG. 1, the main extension planes of the respective layers of the first layer sequence 10 and/or the second layer sequence 20 in the present case run not only perpendicular to the stacking direction Z, but also partially parallel to the stacking direction Z.

The organic device of FIG. 3 comprises the first layer stack 10 having lateral surfaces 10b which run along the stacking direction Z. The lateral surfaces 10b of the first layer stack 10 are covered by the second electrode 32.

Furthermore, the organic component 1 comprises lateral surfaces 1b. At least one of the lateral surfaces 1b of the organic component here is completely covered by the layer structure 21. It is possible here that the first layer stack 10 protects, by the second electrode 32, against the solvent optionally contained in the layer structure 21. To this end, the second electrode 32 can encapsulate the first layer stack 10 toward the layer structure 21.

Furthermore, the organic device comprises an insulating layer 6, by means of which the first electrode 31 is electrically insulated from the second electrode 32 and/or the organic component 1 is electrically insulated from the organic protection diode 2. The second layer stack 20 of the organic protection diode 2 additionally comprises at least one lateral surface 20b, which is completely covered by the third electrode 42 and can be encapsulated externally by the third electrode 42.

Furthermore, the first layer stack 10 of the organic component 1 is encapsulated externally by the insulating layer 6, the first electrode 32, the layer structure 21, the matrix layer 22, the further layer 23, the third electrode 42 and/or the connecting layer 34.

Figure 4:
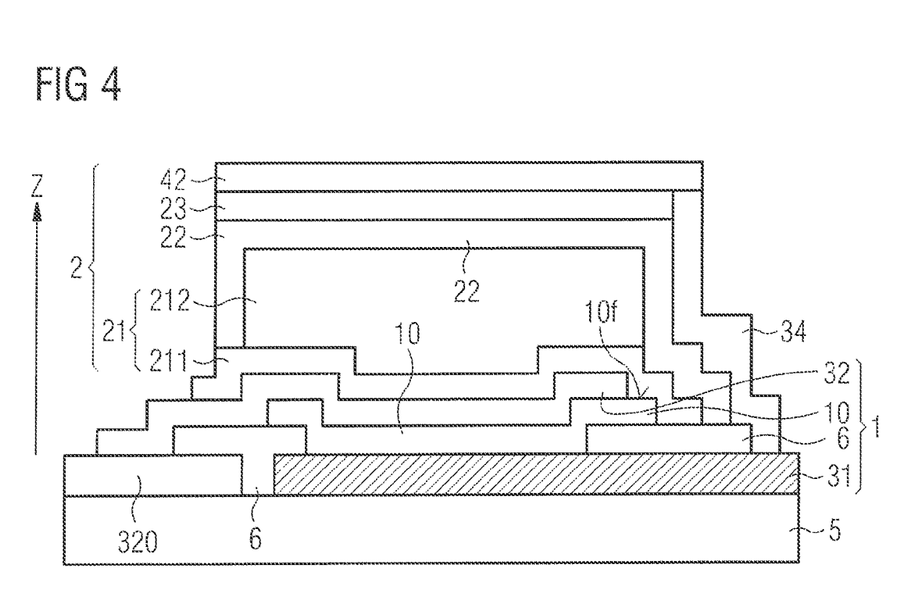

According to the sectional illustration of FIG. 4, a further exemplary embodiment of an organic device as described here is explained in more detail. To supplement the exemplary embodiment shown in FIG. 3, a contact 320 mounted on the substrate 5 at a lateral distance from the first layer stack 10 is illustrated in FIG. 4. The contact 320 is in direct electrical contact with the second electrode 32 and serves to provide electrical contact with the second electrode 32. In addition, the insulating layer 6 in the exemplary embodiment illustrated is patterned and annularly surrounds the first layer sequence 10.

Furthermore, the layer structure 21 in the exemplary embodiment of FIG. 4 comprises a sealing layer 211 and a buffer layer 212. The buffer layer 212 is applied to the sealing layer 211, e.g., by a solution-processed method.

The sealing layer 211 completely covers all external surfaces of the second electrode 32 facing away from the first layer stack 10 in the area of the buffer layer 21. In other words, the sealing layer 211 covers all areas of the second electrode 32 facing the buffer layer 212. In addition, the sealing layer 211 seals positions 10f of the first layer stack 10 which are not covered by the second electrode 32 against the buffer layer 212.

The buffer layer 212 serves inter alia as protection from particles from the surrounding air. The sealing layer 211 additionally serves to protect the organic layers of the organic component 1 from the solvent that is used to apply the buffer layer 212. In particular, the buffer layer 212 can have a thickness of at least 5 μm, preferably at least 10 μm in the stacking direction Z. The buffer layer 21, and preferably also the layer structure 21, is/are covered on their external surfaces facing away from the first layer stack 10 by the matrix layer 22. In particular, the matrix layer 22 completely covers the layer structure 21 in the areas in which the layer structure 21 is likewise covered by the third electrode 42 and/or the connecting layer 34. The matrix layer 22 here can extend laterally along the layer structure 21 up to the insulating layer 6 and can be in direct contact with the insulating layer 6.

The second layer stack 20 is covered on its external surfaces facing away from the first layer stack 10 by the fourth electrode 42 and/or laterally by the connecting layer 34. The third electrode 42 and the connecting layer 34 here can serve to encapsulate the organic layers of the first layer stack 10 and/or second layer stack 20 externally.

Figure 5:
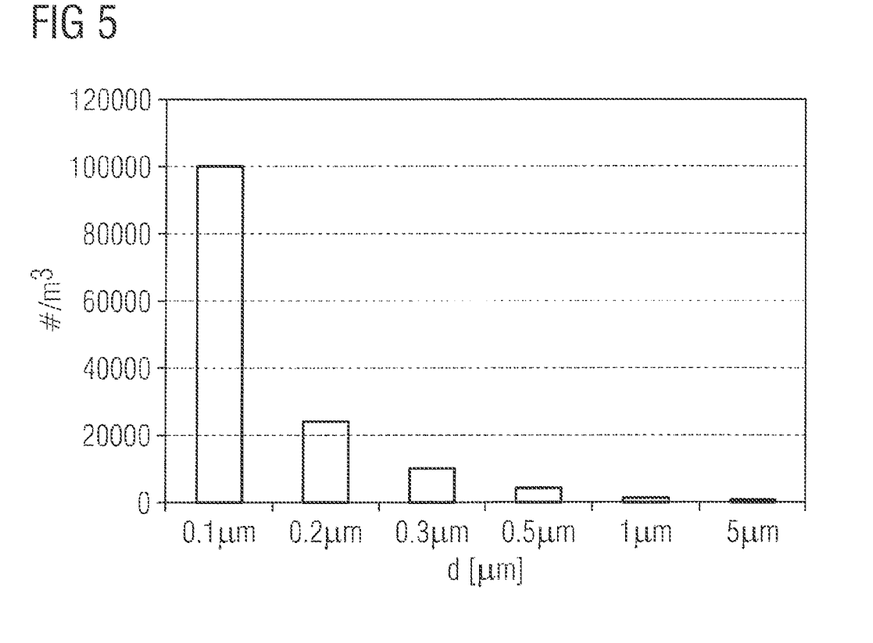
FIG. 5 shows a distribution of the particle sizes in an ISO class 5 clean room.

Using the distribution of the particle sizes in an ISO class 5 clean room of FIG. 5, the way in which the buffer layer 212 functions is explained in more detail. What is shown is the average number of particles # per cubic meter as a function of the particle size d in μm. In an ISO class 5 clean room, which is used for producing an organic device as described here, there are in particular particles having a maximum particle size of 5 μm. During the production of the organic device, for example, these particles can land on the functional layers of the organic component during transport from one vacuum tank to another vacuum tank, resulting in the destruction of said layers. These particles can remain in the buffer layer 212 in the present organic device without damaging the organic component 1.

Figure 6:
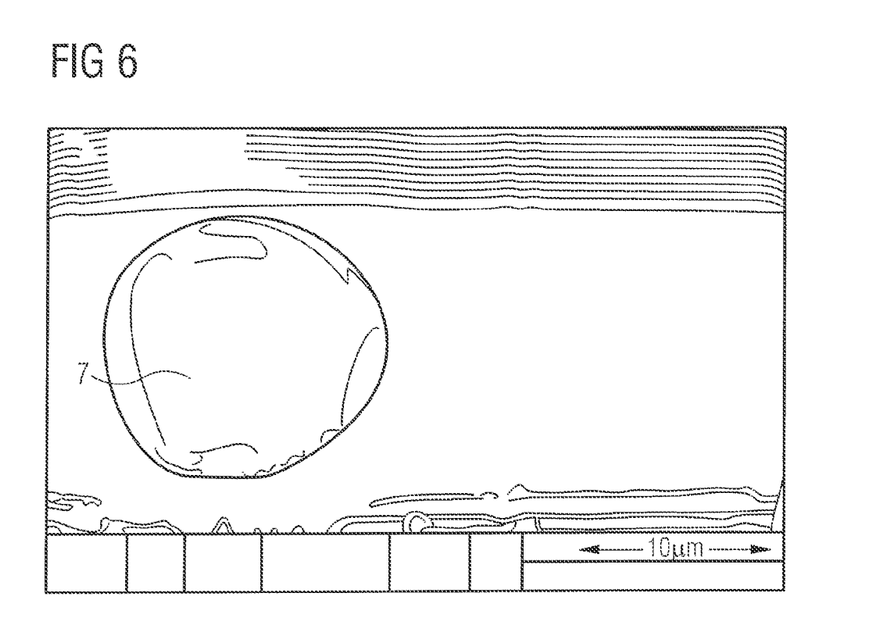
FIG. 6 shows an exemplary image of a particle.

Using the image of FIG. 6, a way in which the buffer layer 212 functions is explained in more detail. FIG. 6 shows an image of a dust particle, the size of which is between about 5 μm and 10 μm, with a scanning electron microscope (SEM). The dust particle is located in the layered composite structure of an organic component.

The description using the exemplary embodiments does not limit the invention thereto. Rather, the invention comprises any new feature and any combination of features, which in particular includes any combination of features in the patent claims, even if this feature or this combination is not per se explicitly stated in the patent claims or exemplary embodiments.

The invention claimed is:

1. An organic device comprising:
    an organic component designed to emit and/or detect radiation, wherein the organic component comprises a first layer stack and a radiation passage surface;
    an organic protection diode comprising a second layer stack;
    a first electrode;
    a second electrode mounted on a side of the first layer stack facing away from the first electrode; and
    a third electrode mounted on a side of the second layer stack facing away from the first electrode,
    wherein the second electrode is in direct electrical and/or physical contact with the first layer stack and the second layer stack,
    wherein the first electrode and the third electrode are connected to one another in an electrically conductive manner,
    wherein the organic protection diode is arranged directly after the organic component in a stacking direction (Z), and
    wherein the organic protection diode is designed to protect the organic component from an electrostatic discharge and/or from a polarity reversal of the organic component,
    wherein the second layer stack comprises a layer structure, and wherein the layer structure has a thickness in the stacking direction (Z) of at least 10 μm and no more than 200 μm.

2. The organic device according to claim 1, wherein a p-n junction of the organic protection diode is connected antiparallel to a p-n junction of the organic component.

3. The organic device according to claim 1, wherein the first electrode and the third electrode are connected in an electrically conductive manner by a connecting layer, and wherein the connecting layer extends along the stacking direction (Z) on at least one lateral surface of the organic component and/or at least one lateral surface of the organic protection diode.

4. The organic device according to claim 1, wherein the layer structure is arranged between the first electrode and the third electrode.

5. The organic device according to claim 1, wherein the layer structure comprises at least one buffer layer, and wherein the buffer layer is produced by a solution-processed method.

6. The organic device according to claim 1, wherein the layer structure comprises a buffer layer and at least one sealing layer, and wherein the sealing layer is arranged between the first layer stack and the buffer layer in the stacking direction (Z), the sealing layer and the buffer layer are produced by different methods and the buffer layer comprises at least 10 times the thickness of the sealing layer.

7. The organic device according to claim 5, wherein the second electrode is formed using a material which is insoluble in a solvent used in the solution-processed method, and wherein the second electrode covers at least one of the lateral surfaces of the first layer stack.

8. The organic device according to claim 6, wherein the sealing layer of the layer structure is adjacent to the second electrode and completely covers this on external surfaces of the second electrode facing away from the first layer stack in an area of the buffer layer.

9. The organic device according to claim 1, wherein the second electrode comprises an ALD layer.

10. The organic device according to claim 1, wherein the organic component is covered completely by at least one layer of the organic protection diode on external surfaces thereof facing away from the radiation passage surface.

11. The organic device according to claim 1, wherein the first layer stack is covered and/or encapsulated completely by at least one layer of the organic protection diode on an external surface thereof facing away from the radiation passage surface.

12. An organic device comprising:
an organic component designed to emit and/or detect radiation, wherein the organic component comprises a first layer stack and a radiation passage surface;
an organic protection diode having a second layer stack, wherein the organic protection diode is arranged directly after the organic component in a stacking direction (Z), and wherein the organic protection diode is designed to protect the organic component from an electrostatic discharge and/or from a polarity reversal of the organic component;
a first electrode;
a second electrode mounted on a side of the first layer stack facing away from the first electrode; and
a third electrode mounted on a side of the second layer stack facing away from the first electrode,
wherein the second electrode is in direct electrical and/or physical contact with the first layer stack and the second layer stack,
wherein the first electrode and the third electrode are connected to one another in an electrically conductive manner by a connecting layer, and wherein the connecting layer extends along the stacking direction (Z) on at least one lateral surface of the organic component and/or at least one lateral surface of the organic protection diode.

13. An organic device comprising:
an organic component designed to emit and/or detect radiation, wherein the organic component comprises a first layer stack and a radiation passage surface;
an organic protection diode comprising a second layer stack;
a first electrode;
a second electrode mounted on a side of the first layer stack facing away from the first electrode; and
a third electrode mounted on a side of the second layer stack facing away from the first electrode,
wherein the second electrode is in direct electrical and/or physical contact with the first layer stack and the second layer stack,
wherein the first electrode and the third electrode are connected to one another in an electrically conductive manner,
wherein the second electrode comprises an ALD layer,
wherein the organic protection diode is arranged directly after the organic component in a stacking direction (Z), and
wherein the organic protection diode is designed to protect the organic component from an electrostatic discharge and/or from a polarity reversal of the organic component.

* * * * *